United States Patent
Lee et al.

(10) Patent No.: US 9,527,118 B2
(45) Date of Patent: Dec. 27, 2016

(54) SYSTEM AND METHOD FOR TREATING A SUBSTRATE

(71) Applicant: Semes Co., Ltd., Cheonan-si, Chungcheongnam-do (KR)

(72) Inventors: Young Hun Lee, Asan-si (KR); Eui Sang Lim, Busan (KR); Jae Myoung Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 14/934,200

(22) Filed: Nov. 6, 2015

(65) Prior Publication Data
US 2016/0133454 A1 May 12, 2016

(30) Foreign Application Priority Data
Nov. 10, 2014 (KR) .................. 10-2014-0155664

(51) Int. Cl.
| | |
|---|---|
| H01L 21/331 | (2006.01) |
| H01L 21/8222 | (2006.01) |
| B08B 7/00 | (2006.01) |
| H01L 21/02 | (2006.01) |
| H01L 21/67 | (2006.01) |

(52) U.S. Cl.
CPC ....... B08B 7/0021 (2013.01); H01L 21/02057 (2013.01); H01L 21/02101 (2013.01); H01L 21/67028 (2013.01); H01L 21/67051 (2013.01); H01L 21/67069 (2013.01)

(58) Field of Classification Search
CPC .............. H01L 21/02046; H01L 21/02041; H01L 21/02049; H01L 21/02219; H01L 21/0223; H01L 21/02233; H01L 21/02167; B08B 7/0021

USPC .......... 438/311, 459, 706, 745, 913; 257/77, 257/347, E21.005, E21.027, E21.041, 257/E21.054, E21.055, E21.077, E21.082, 257/E21.218, E21.227, E21.229, E21.248, 257/E21.251, E21.32
See application file for complete search history.

(56) References Cited

U.S. PATENT DOCUMENTS

| | | | | |
|---|---|---|---|---|
| 7,219,677 | B1 * | 5/2007 | Jackson | ............ H01L 21/02101 |
| | | | | 134/94.1 |
| 7,601,112 | B2 * | 10/2009 | Jackson | .................... B08B 3/06 |
| | | | | 494/37 |
| 8,084,367 | B2 * | 12/2011 | Lee | .................... H01L 21/02101 |
| | | | | 438/745 |
| 8,197,603 | B2 * | 6/2012 | Jackson | ................ B08B 7/0021 |
| | | | | 134/1.2 |
| 8,585,917 | B2 * | 11/2013 | Lee | ................................ 216/83 |
| 8,748,325 | B2 * | 6/2014 | Horikawa | .......... H01L 21/02118 |
| | | | | 438/780 |
| 8,790,470 | B2 * | 7/2014 | Lee | .................... H01L 21/02101 |
| | | | | 134/1.3 |

(Continued)

FOREIGN PATENT DOCUMENTS

| | | |
|---|---|---|
| JP | 2013062417 A | 4/2013 |
| KR | 20040074632 A | 8/2004 |

(Continued)

*Primary Examiner* — David Nhu
(74) *Attorney, Agent, or Firm* — Harness, Dickey & Pierce, P.L.C.

(57) ABSTRACT

Disclosed are systems and methods for treating a substrate. The method may include supplying supercritical carbon dioxide into a chamber to treat a substrate. Here, temperature and pressure of the chamber is maintained to allow carbon dioxide to be directly changed from a gas state to a supercritical state when the carbon dioxide is supplied into the chamber.

2 Claims, 7 Drawing Sheets

(56) References Cited

U.S. PATENT DOCUMENTS

2008/0206462 A1* 8/2008 Ode .................. C23C 18/00
427/248.1

FOREIGN PATENT DOCUMENTS

| KR | 20120041014 A | 4/2012 |
|----|---------------|--------|
| KR | 101329304 B1 | 11/2013 |
| KR | 101367468 B1 | 2/2014 |

* cited by examiner

SYSTEM AND METHOD FOR TREATING A SUBSTRATE

CROSS-REFERENCE TO RELATED APPLICATIONS

This U.S. non-provisional patent application claims priority under 35 U.S.C. §119 to Korean Patent Application No. 10-2014-0155664, filed on Nov. 11, 2014, in the Korean Intellectual Property Office, the entire contents of which are hereby incorporated by reference.

BACKGROUND OF THE INVENTION

Example embodiments of the inventive concept relate to a system and a method for treating a substrate, and in particular, to a system and a method for cleaning a substrate.

In general, a semiconductor device is fabricated by performing various processes (e.g., a photolithography process, an etching process, an ion implantation process, and a deposition process) on a substrate (e.g., a silicon wafer).

In each process, various foreign substances (e.g., particles, organic contaminants, and metallic impurities) may be produced. The foreign substances may lead to process defects in a subsequent process of treating a substrate and thereby deterioration in performance and yield of a semiconductor device, and thus, in a process of fabricating a semiconductor device, it is necessary to perform a cleaning process for removing such foreign substances.

The cleaning process may include a chemical treating process of removing contaminants from a surface of a substrate using chemicals, a wet cleaning process of removing remaining chemicals from the surface of the substrate using pure or de-ionized water, and a drying process of supplying dehydration fluid on the surface of the substrate to remove remnants of the pure water.

In the past, the drying process was performed in such a way to supply heated nitrogen gas on a substrate, on which pure water remains. However, a reduction in line width or an increase in aspect ratio of patterns led to a great difficulty in removing the pure water from narrow gaps between the patterns. To overcome this problem, in a recent drying process, the pure water remaining on a substrate is replaced with liquid organic solvent (e.g., isopropyl alcohol) that have high volatility and low surface tension, compared with the pure water, and then, heated nitrogen gas is supplied to dry the substrate.

However, there is a difficulty in mixing non-polar organic solvent with polar water, and thus, in order to replace the pure water with the liquid organic solvent, it is necessary to supply a large amount of liquid organic solvent onto the substrate for a long time.

However, although the organic solvent is used for the drying process, it is difficult to avoid the problem of pattern collapse in sub-30 nm semiconductor devices. Recently, a process of drying a substrate using supercritical fluid is recently being developed as an alternative to such conventional drying processes.

SUMMARY

Example embodiments of the inventive concept provide a substrate treating system configured to perform a substrate drying process using a supercritical fluid with efficiency and a method of performing the substrate drying process using the system.

Example embodiments of the inventive concept provide a method for treating a substrate.

According to example embodiments of the inventive concept, a method of treating a substrate may include supplying supercritical carbon dioxide into a chamber to treat a substrate. Temperature and pressure of the chamber may be maintained to allow carbon dioxide to be directly changed from a gas state to a supercritical state, when the carbon dioxide is supplied into the chamber.

In some embodiments, the treating of the substrate may include drying the substrate using the supercritical carbon dioxide.

In some embodiments, the drying of the substrate may be performed to remove organic solvent from a gap between patterns of the substrate.

Example embodiments of the inventive concept also provide a system configured to treat a substrate.

According to example embodiments of the inventive concept, a substrate treating system may include a chamber, in which a treatment space is provided, a supporting unit provided in the treatment space to support the substrate, a fluid supplying unit configured to supply supercritical carbon dioxide into the treatment space, a heater configured to heat the chamber, and a controller configured to heat the heater. The controller may control the heater in such a way that temperature of the chamber is maintained to allow carbon dioxide to be directly changed from a gas state to a supercritical state when the carbon dioxide is supplied into the chamber.

In some embodiments, the fluid supplying unit may include a valve configured to control an amount of fluid to be supplied into the chamber, and the controller controls the valve. The controller may control the valve in such a way that pressure of the chamber is maintained to allow carbon dioxide to be directly changed from a gas state to a supercritical state when the carbon dioxide is supplied into the chamber.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
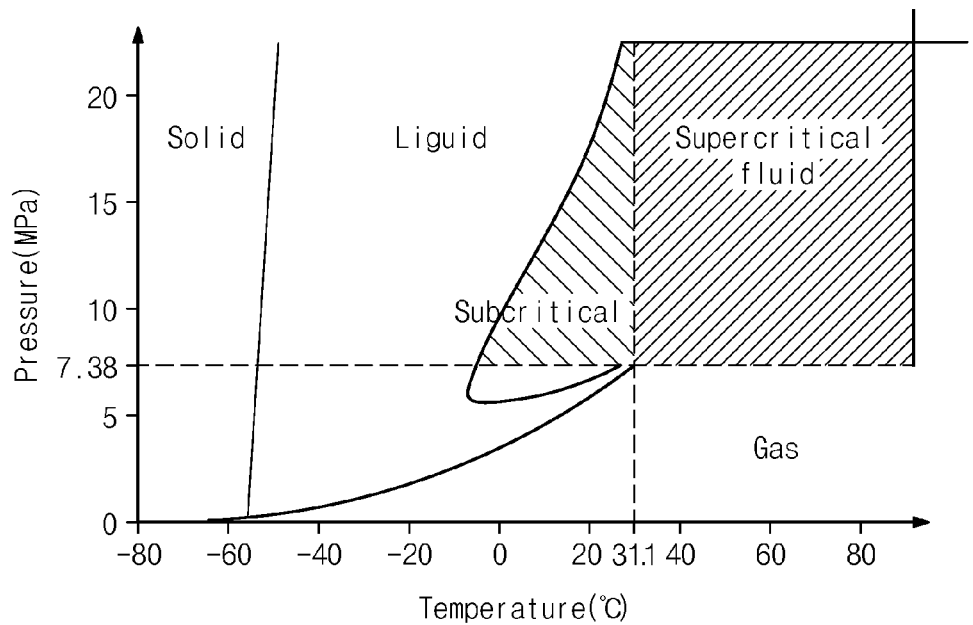
FIG. 1 is a pressure-temperature phase diagram of carbon dioxide.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a substrate treating system 100 according to example embodiments of the inventive concept will be described.

The substrate treating system 100 may be configured to perform a supercritical process of treating a substrate S using a supercritical fluid as a process fluid.

Here, the substrate S may be one of a variety of substrates, on which circuit patterns (e.g., for semiconductor devices, flat panel display (FPD) devices, and so forth) can be formed. As an example, the substrate S may be a silicon wafer, but example embodiments of the inventive concept may not be limited thereto. For example, various substrates, such as wafers, glass substrates, or organic substrates, may be used as the substrate S.

Hereinafter, the term 'supercritical fluid' refers to specific phase state of gas and liquid that is formed above its critical temperature and critical pressure. The supercritical fluid has a molecular density close to that of liquid and viscosity close to that of gas. Accordingly, the supercritical fluid has good benefits in various characteristics (e.g., in diffusion, penetration, and solvency) for a chemical reaction. In addition, the supercritical fluid has a very low surface tension, allowing fine patterns not to be affected by an interfacial tension.

The supercritical process may refer to a process, in which supercritical fluid is used, and may include a supercritical drying process and a supercritical etching process. For the sake of simplicity, the description that follows will refer to an example of the supercritical drying process. Example embodiments of the inventive concept may not be limited to these examples; for example, the substrate treating system 100 may be used to perform supercritical processes, other than the supercritical drying process.

The supercritical drying process may be performed in such a way that organic solvent remaining between circuit patterns is mixed with supercritical fluid and then the mixture is removed from the substrate S. The use of the supercritical drying process may make it possible to achieve high efficiency in a substrate drying process and to prevent pattern collapse. In the supercritical drying process, at least one of materials having high miscibility with organic solvent may be used as the supercritical fluid. As an example, supercritical carbon dioxide ($scCO_2$) may be used as the supercritical fluid.

FIG. 1 is a pressure-temperature phase diagram of carbon dioxide.

Since carbon dioxide has a critical temperature of 31.1° C. and a relatively low critical pressure of 7.38 Mpa, it is possible to easily and cost effectively realize a supercritical state of carbon dioxide, and moreover, by adjusting a process temperature and process pressure, it is easy to control a change in phase of the carbon dioxide. Also, the carbon dioxide has non-toxic, nonflammable, and inactive properties, and since the supercritical carbon dioxide has a very high diffusion coefficient (e.g., about 10-100 times those of the water or other organic solvents), it can be used to quickly replace organic solvent. Furthermore, since the supercritical carbon dioxide has a very low surface tension, the use of the supercritical carbon dioxide makes it possible to effectively dry a substrate provided with circuit pattern. In addition, since the carbon dioxide is produced as a by-product in various chemical reactions, recycling of the carbon dioxide is environment-friendly. In particular, in the case where the carbon dioxide is used as a process fluid in the supercritical drying process, it is possible to separate the carbon dioxide from organic solvent contained in the process fluid (for example, by changing the phase of carbon dioxide into the gaseous state) and moreover to reuse the separated carbon dioxide in a subsequent process, and this may make it possible to reduce burden in the supercritical drying process.

Hereinafter, some examples of the substrate treating system 100 according to example embodiments of the inventive concept will be described with reference to the accompanying drawings. In some embodiments, the substrate treating system 100 may be configured to perform a cleaning process (e.g., including a supercritical drying process).

Figure 2:
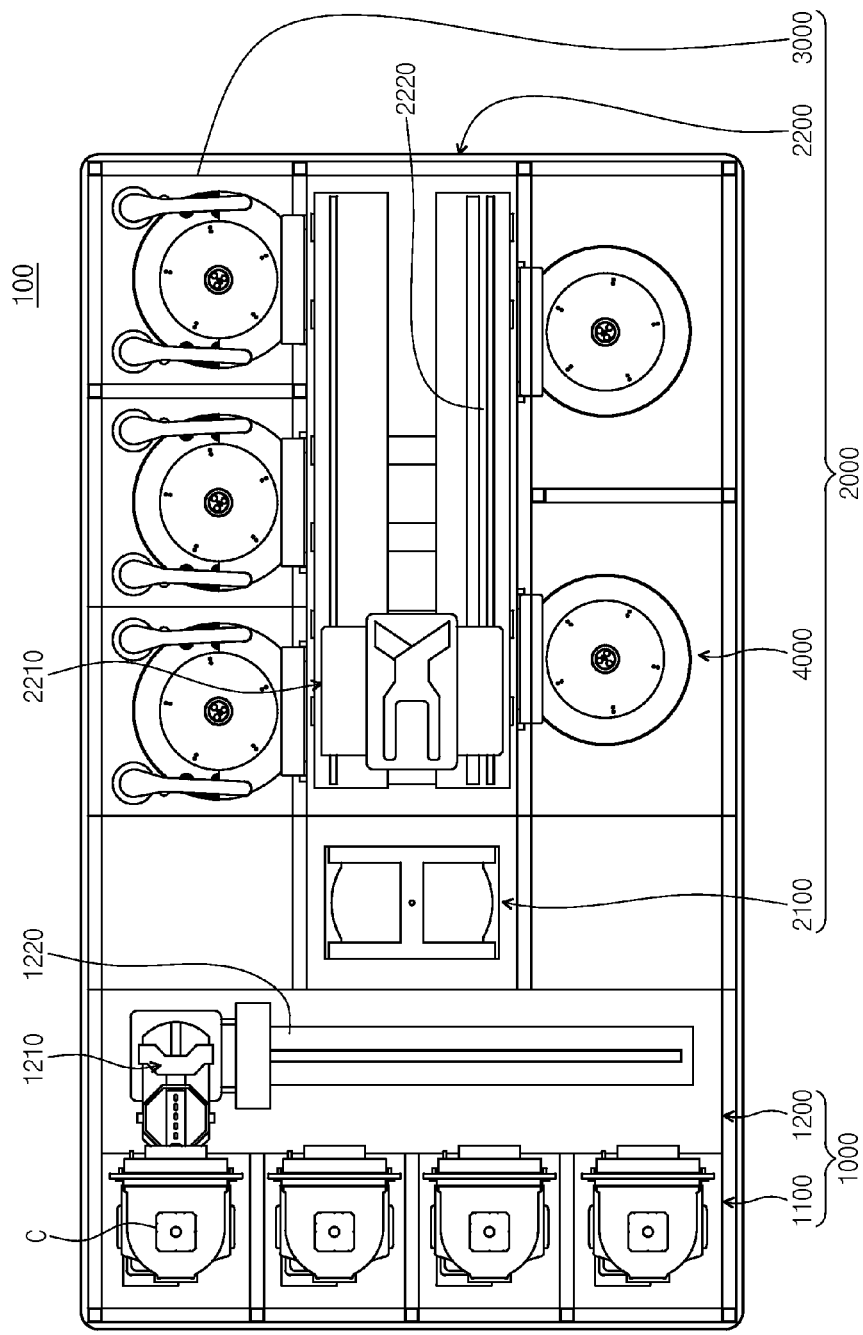
FIG. 2 is a plan view illustrating a substrate treating system according to example embodiments of the inventive concept.

FIG. 2 is a plan view illustrating a substrate treating system according to example embodiments of the inventive concept.

Referring to FIG. 2, the substrate treating system 100 may include an index module 1000 and a process module 2000.

The index module 1000 may be configured to receive a substrate S from the outside and send the substrate S to the process module 2000. In some embodiments, the process module 2000 may be configured to perform a supercritical drying process.

The index module 1000 may serve as an equipment front end module (EFEM) and may include a load port 1100 and a transfer frame 1200.

A carrier C may be provided in the rod port 1100 to contain the substrate S. The carrier C may be provided in the form of a front-opening-unified pod (FOUP). The carrier C may be loaded from the outside to the load port 1100 or may be unloaded from the load port 1100 to the outside by an overhead transfer (OHT) system.

The transfer frame 1200 may be configured to allow the substrate S to be transferred between the carrier C loaded on the rod port 1100 and the process module 2000. The transfer frame 1200 may include an index robot 1210 and an index rail 1220. The index robot 1210 may be configured to move along the index rail 1220 and carry the substrate S.

The process module 2000 may include a buffer chamber 2100, a transfer chamber 2200, a first process chamber 3000, and a second process chamber 4000.

The buffer chamber 2100 may be configured to temporarily store the substrate S, which will be transferred between the index and process modules 1000 and 2000. A buffer slot may be provided in the buffer chamber 2100. The substrate S may be disposed in the buffer slot. For example, the substrate S may be ejected from the carrier C and may be disposed in the buffer slot, by the index robot 1210. A transfer robot 2210 may be provided in the transfer chamber 2200 to allow the substrate S to be ejected from the buffer slot and then be transferred to the first or second process chamber 3000 or 400. In certain embodiments, a plurality of buffer slots may be provided in the buffer chamber 2100, and in this case, a plurality of the substrates S may be disposed in the buffer slots, respectively, of the buffer chamber 2100.

The transfer chamber 2200 may be configured to allow the substrate S to be transferred among the buffer chamber 2100, the first process chamber 3000, and the second process chamber 4000, which are disposed near transfer chamber 2200. The transfer chamber 2200 may include the transfer robot 2210 and a transfer rail 2220. The transfer robot 2210 may be configured to move along the transfer rail 2220 and carry the substrate S.

At least one of the first and second process chambers 3000 and 4000 may be configured to perform a cleaning process. For example, the cleaning process may be sequentially performed in the first and second process chambers 3000 and 4000. As an example, a chemical process, a rinse process, and an organic solvent process constituting the cleaning process may be performed in the first process chamber 3000. Thereafter, a supercritical dry process may be performed in the second process chamber 4000.

Each of the first and second process chambers 3000 and 4000 may be disposed at a side region of the transfer chamber 2200. For example, the first and second process chambers 3000 and 4000 may be disposed at opposite sides of the transfer chamber 2200 to face each other.

A plurality of the first process chambers 3000 and a plurality of the second process chambers 4000 may be provided in the process module 2000. The process chambers 3000 and 4000 may be disposed to have a linear arrangement at a side region of the transfer chamber 2200, a vertically-stacked arrangement, or a vertically-stacked linear arrangement.

The arrangements of the first and second process chambers 3000 and 4000 are not limited to these examples and may be variously modified in consideration of technical issues (e.g., foot-print or process efficiency) associated with the substrate treating system 100.

Hereinafter, some features of the first process chamber 300 will be described in more detail.

Figure 3:
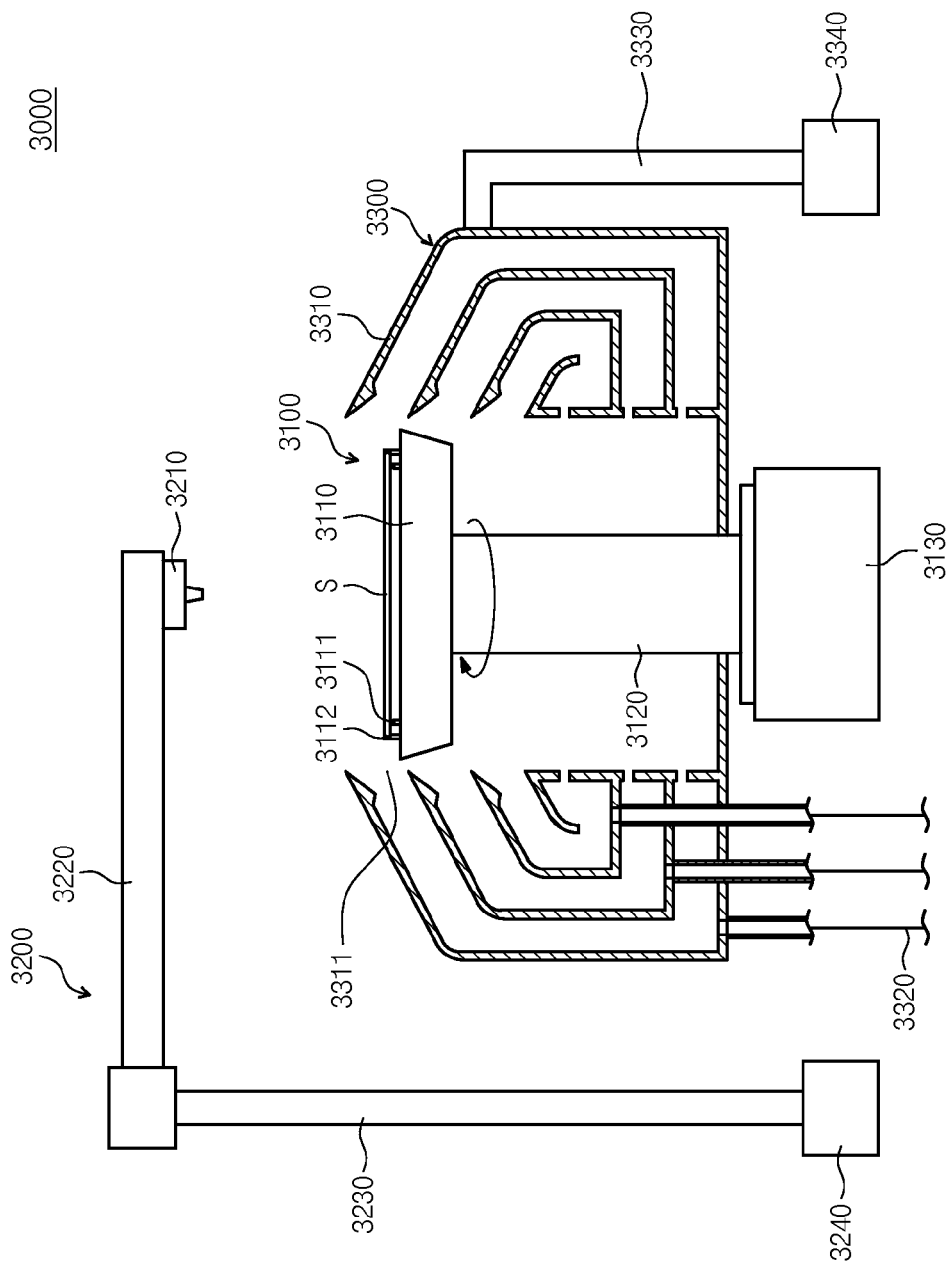
FIG. 3 is a sectional view illustrating an example of the first process chamber of FIG. 2.

FIG. 3 is a sectional view illustrating the first process chamber of FIG. 2.

The first process chamber 3000 may be configured to perform a chemical process, a rinse process, and an organic solvent process. In certain embodiments, one or some of these processes may be selectively performed in the first process chamber 3000. Here, the chemical process may include supplying a cleaning agent onto the substrate S to remove foreign substances from the substrate S. The rinse process may include supplying a rinse agent onto the substrate S to remove at least a fraction of the cleaning agent remaining on the substrate S. The organic solvent process may include supplying an organic solvent onto the substrate S to replace or substitute the rinse agent remaining between circuit patterns of the substrate S with the organic solvent with low surface tension.

Referring to FIG. 3, the first process chamber 3000 may include a supporting member 3100, a nozzle member 3200, and a collecting member 3300.

The supporting member 3100 may be configured to support the substrate S. The supporting member 3100 may also be configured to rotate the substrate S supported thereby. The supporting member 3100 may include a supporting plate 3110, a supporting pin 3111, a chuck pin 3112, a rotating axis 3120, and a rotating actuator 3130.

The supporting plate 3110 may have a top surface, whose shape is the same or similar to that of the substrate S. The supporting pin 3111 and the chuck pin 3112 may be provided on the top surface of the supporting plate 3110. The supporting pin 3111 may be used to support a bottom surface of the substrate S. The chuck pin 3112 may be used to fasten the substrate S supported by the supporting pin 3111.

The rotating axis 3120 may be connected to a bottom portion of the supporting plate 3110. The rotating actuator 3130 may be configured to rotate the supporting plate 3110 through the rotating axis 3120. Accordingly, the substrate S may be rotated along with the supporting plate 3110. The chuck pin 3112 may prevent the substrate S from being deviated from a normal position thereof.

The nozzle member 3200 may be configured to spray a treatment solution onto the substrate S. The nozzle member 3200 may include a nozzle 3210, a nozzle bar 3220, a nozzle axis 3230, and a nozzle axis actuator 3240.

The nozzle 3210 may be configured to spray the treatment solution onto the substrate S loaded on the supporting plate 3110. The treatment solution may be at least one of cleaning agent, rinse agent, or organic solvent. In some embodiments, the cleaning agent may include hydrogen peroxide ($H_2O_2$) solution, hydrogen peroxide solution mixed with ammonia ($NH_4OH$), hydrochloric acid (HCl), or sulfuric acid ($H_2SO_4$), or hydrofluoric acid (HF) solution. The rinse agent may be pure or de-ionized water. The organic solvent may be provided in the form of at least one of solution or gas of isopropyl alcohol, ethyl glycol, 1-propanol, tetra hydraulic franc, 4-hydroxyl, 4-methyl, 2-pentanone, 1-butanol, 2-butanol, methanol, ethanol, n-propyl alcohol, or dimethyl ethyl.

The nozzle 3210 may be provided on a bottom surface of the nozzle bar 3220. The nozzle bar 3220 may be coupled to the nozzle axis 3230. The nozzle axis 3230 may be configured to be moved in a vertical direction or be rotated by the nozzle axis actuator 3240. The nozzle axis actuator 3240 may change a vertical position and/or a rotation angle of the nozzle axis 3230 to adjust a position of the nozzle 3210.

The collecting member 3300 may be configured to retrieve treatment solution supplied onto the substrate S. When the treatment solution is supplied onto the substrate S through the nozzle member 3200, the substrate S may be rotated by the supporting member 3100, and in this case, the whole region of the substrate S may be uniformly covered with the treatment solution. The rotation of the substrate S may lead to an outward scattering of the treatment solution. The collecting member 3300 may be configured to retrieve a fraction of the treatment solution to be scattered from the substrate S.

For example, the collecting member 3300 may include a collecting barrel 3310, a collecting line 3320, a lifting bar 3330, and a lifting actuator 3340.

The collecting barrel 3310 may be provided to have a circular ring-shaped structure enclosing the supporting plate 3110. In some embodiments, the collecting member 3300 may include a plurality of collecting barrels 3310. The collecting barrels 3310 may be provided to have diameters and heights increasing in a direction away from the supporting plate 3110, and, when viewed in a plan view, each of the collecting barrels 3310 may have a ring-shaped structure. The taller the collecting barrel 3310, the farther it is from the supporting plate 3110. A collecting hole 3311 may be formed between the collecting barrels 3310, and thus, a fraction of the treatment solution to be scattered from the substrate S may be retrieved through the collecting hole 3311.

The collecting line 3320 may be connected to the collecting barrel 3310 through a bottom surface of the collecting barrel 3310. The treatment solution collected in the collecting barrel 3310 may be supplied to a treatment solution recycling system (not shown) through the collecting line 3320.

The lifting bar 3330 may be connected to the collecting barrel 3310. Power may be transmitted from the lifting actuator 3340 to the lifting bar 3330, and such power may be used to change a vertical position of the collecting barrel 3310. In the case where a plurality of the collecting barrels 3310 are provided, the lifting bar 3330 may be connected to the outermost one of the collecting barrels 3310. The lifting actuator 3340 may control the lifting bar 3330 to adjust a vertical position of the collecting barrel 3310, and this may make it possible to allow the scattering fraction of the treatment solution to be mainly collected through a selected one of the collecting holes 3311.

Hereinafter, technical features associated with the second process chamber 4000 will be described.

The second process chamber 4000 may be configured to perform a supercritical drying process using supercritical fluid. For example, the supercritical drying process of removing an organic solvent from gaps between patterns of the substrate S may be performed in the second process chamber 4000. In certain embodiments, the second process chamber 4000 may be configured to perform a supercritical process, other than the supercritical drying process.

Hereinafter, the second process chamber 4000 according to example embodiments of the inventive concept will be described in more detail with reference to FIG. 4.

Figure 4:
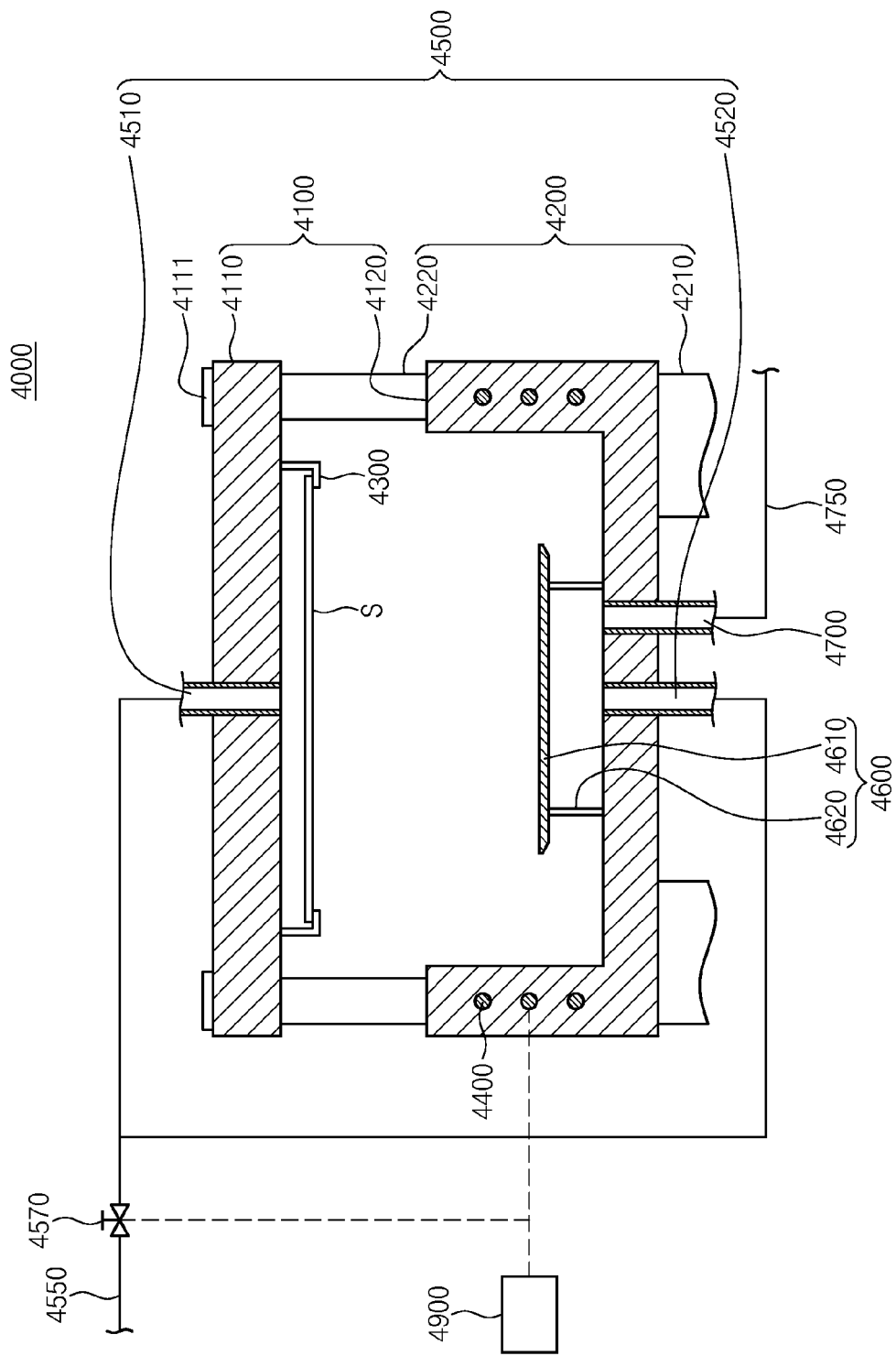
FIG. 4 is a sectional view illustrating an example of the second process chamber of FIG. 2.

FIG. 4 is a sectional view illustrating an example of the second process chamber of FIG. 2.

Referring to FIG. 4, the second process chamber 4000 may include a chamber 4100, a lifting unit 4200, a supporting unit 4300, a heater 4400, a fluid supplying unit 4500, a blocking member 4600, an exhausting member 4700, and a controller 4900.

The chamber 4100 may provide a treatment space, in which the supercritical drying process will be performed. The chamber 4100 may be formed of a material capable of enduring a higher pressure than the critical pressure.

The chamber 4100 may include an upper housing 4110 and a lower housing 4120. The upper housing 4110 may be disposed below the lower housing 4120 and may be vertically separated from the lower housing 4120.

The upper housing 4110 may be fixedly attached to an external structure. The lower housing 4120 may be configured to be vertically movable with respect to the upper housing 4110. If the lower housing 4120 is moved in a downward direction to be spaced apart from the upper housing 4110, the treatment space provided in the second process chamber 4000 may be opened. The substrate S may be inserted into or unloaded from the opened treatment space of the second process chamber 4000. When the organic solvent process in the first process chamber 3000 is finished, the substrate S is injected into the second process chamber 4000, and thus, the organic solvent may remain on the substrate S to be injected into the second process chamber 4000. If the lower housing 4120 is moved in an upward direction to be in contact with the upper housing 4110, the treatment space in the second process chamber 4000 may be hermetically closed. The supercritical drying process may be performed in the closed treatment space. In certain embodiments, the chamber 4100 may be configured in such a way that the lower housing 4120 is fixed and the upper housing 4110 is vertically movable.

The lifting unit 4200 may be configured to change a vertical position of the lower housing 4120. The lifting unit 4200 may include a lifting cylinder 4210 and a lifting rod 4220. The lifting cylinder 4210 may be connected to the lower housing 4120 to allow a vertical driving force to be exerted to the lower housing 4120. During the supercritical drying process, the magnitude of the vertical driving force exerted through the lifting cylinder 4210 may be high enough to prevent any leakage path from being formed between the upper and lower housings 4110 and 4120 and thereby to hermetically seal the second process chamber 4000, under a high internal pressure (e.g., higher than the critical pressure) of the second process chamber 4000. The lifting rod 4220 may have a vertically-extended structure including an end portion inserted into the lifting cylinder 4210 and an opposite end portion coupled to the upper housing 4110. If the driving force is exerted to the lifting cylinder 4210, the lifting cylinder 4210 and the lifting rod 4220 may be vertically moved to change a vertical position of the lower housing 4120 coupled to the lifting cylinder 4210. When the vertical position of the lower housing 4120 is changed by the lifting cylinder 4210, the lifting rod 4220 may prevent the upper and lower housings 4110 and 4120 from moving in a horizon direction and may guide the upper and lower housings 4110 and 4120 along the vertical direction; that is, the lifting rod 4220 may prevent the upper and lower housings 4110 and 4120 from being deviated from their normal positions.

The supporting unit 4300 may be provided in the treatment space of the chamber 4100 to support the substrate S.

The supporting unit 4300 may include a vertical portion vertically extending downward from a bottom surface of the upper housing 4110 and another portion laterally extending from a bottom end of the vertical portion toward a center of the upper housing 4110. The supporting unit 4300 may support an edge region of the substrate S. Since the supporting unit 4300 may be in contact with the edge region of the substrate S to support the substrate S, the supercritical drying process may be performed on the entire top surface and most of the bottom surface of the substrate S. Here, in the substrate S, the top surface may serve as an active surface provided with patterns and the bottom surface may serve as an inactive surface without any pattern.

The supporting unit 4300 may be coupled to the upper housing 4110. The supporting unit 4300 may be configured to support the substrate S in a relatively stable manner, when the lower housing 4120 is moved in the vertical direction.

A level adjusting member 4111 may be disposed in the upper housing 4110 provided with the supporting unit 4300. The level adjusting member 4111 may be configured to adjust a level or horizontality of the upper housing 4110. The adjustment of the level of the upper housing 4110 may make it possible to adjust a level or horizontality of the substrate S disposed on the supporting unit 4300.

If the substrate S is inclined during the supercritical drying process, the organic solvent remaining on the substrate S may flow down along the inclined surface of the substrate S. In this case, a portion of the substrate S may be insufficiently or excessively dried, and this may lead to damage of the substrate S. Since the level of the substrate S can be controlled by the level adjusting member 4111, it is possible to prevent this technical issue. In the case where the upper housing 4110 is vertically movable and the lower housing 4120 is fixed or the supporting unit 4300 is installed to the lower housing 4120, the level adjusting member 4111 may be installed to the lower housing 4120.

The heater 4400 may be configured to increase an internal temperature of the second process chamber 4000. For example, the supercritical fluid supplied into the second process chamber 4000 may be heated by the heater 4400 to have a predetermined temperature (e.g., higher than a critical temperature), allowing the supercritical fluid to be maintained in its supercritical phase. In other words, if the temperature of the supercritical fluid decreases, the heater 4400 may heat the second process chamber 4000 to allow the supercritical fluid to be maintained in its supercritical phase. The heater 4400 may be buried in a wall of at least one of the upper and lower housings 4110 and 4120. The heater 4400 may be configured to generate heat using an electric power supplied from the outside.

The fluid supplying unit 4500 may be configured to supply fluid to the second process chamber 4000. As an example, the fluid may be carbon dioxide.

The fluid supplying unit 4500 may include an upper fluid supplying part 4510, a lower fluid supplying part 4520, a supplying line 4550, and a valve 4570.

The upper fluid supplying part 4510 may be configured to supply the supercritical fluid onto the top surface of the substrate S. The upper fluid supplying part 4510 may be connected to the upper housing 4110. For example, the upper fluid supplying part 4510 may be connected to a portion of the upper housing 4110 facing a center region of the top surface of the substrate S.

The lower fluid supplying part 4520 may be configured to supply the supercritical fluid onto the bottom surface of the substrate S. The lower fluid supplying part 4520 may be connected to the lower housing 4120. The lower fluid supplying part 4520 may be connected to a portion of the lower housing 4120 facing a center region of the bottom surface of the substrate S.

If the supercritical fluid is supplied to the center regions of the substrate S through the upper and lower fluid supplying parts 4510 and 4520, the supercritical fluid may spread from the center regions toward edge regions of the substrate S, and thus, substantially the entire region of the substrate S may be uniformly covered with the supercritical fluid.

The supplying line 4550 may be connected to the upper and lower fluid supplying parts 4510 and 4520. The supplying line 4550 may be used to send the supercritical fluid supplied from the outside to the upper and lower fluid supplying parts 4510 and 4520.

The valve 4570 may be installed on the supplying line 4550. The valve 4570 may be used to control a flow amount of the supercritical fluid to be supplied to the upper and lower fluid supplying parts 4510 and 4520. In certain embodiments, a controller 4900 may be provided to control a switching operation of the valve 4570, and this may make it possible to more precisely adjust flow amount or rate of the supercritical fluid to be supplied in the chamber 4100.

The fluid supplying unit 4500 may be controlled in such a way that the supercritical fluid is firstly supplied into the chamber 4100 through the lower fluid supplying part 4520. Thereafter, the supercritical fluid may be supplied into the chamber 4100 through the upper fluid supplying part 4510. At an initial stage of the supercritical drying process, an inner space of the second process chamber 4000 may have a pressure lower than the critical pressure. In this case, the supercritical fluid supplied into the second process chamber 4000 may be liquefied. The liquefied fluid may fall to the substrate S by gravity, thereby causing damage of the substrate S.

To avoid this technical issue, the supercritical fluid may be firstly supplied through the lower fluid supplying part 4520. For example, the supercritical fluid may be supplied into the second process chamber 4000 through the lower fluid supplying part 4520, until the inner pressure of the second process chamber 4000 reaches the critical pressure. If the inner pressure of the second process chamber 4000 becomes higher than the critical pressure, the supplying of the supercritical fluid through the upper fluid supplying part 4510 may be started. Since the supercritical fluid is firstly supplied through the lower fluid supplying part 4520, not through the upper fluid supplying part 4510, it is possible to prevent the supercritical fluid from being liquefied and falling to the substrate S.

The blocking member 4600 may be configured to prevent the supercritical fluid supplied through the fluid supplying unit 4500 from being directly sprayed the bottom surface of the substrate S. The blocking member 4600 may include a blocking plate 4610 and a supporter 4620.

The blocking plate 4610 may be positioned in the treatment space of the chamber 4100. The blocking plate 4610 may be disposed between the supporting unit 4300 and the lower fluid supplying part 4520. The blocking plate 4610 may be provided in the form of a circular plate. The blocking plate 4610 may have a radius that is similar to or larger than that of the substrate S. The blocking plate 4610 may be positioned below the bottom surface of the substrate S disposed on the supporting unit 4300, and this may make it possible to prevent the supercritical fluid supplied through the lower fluid supplying part 4520 from being directly sprayed the bottom surface of the substrate S. In the case where the radius of the blocking plate 4610 is similar to or larger than that of the substrate S, it is possible to effectively prevent the supercritical fluid from being directly sprayed onto the substrate S.

In certain embodiments, the blocking plate 4610 may be provided to have a radius smaller than that of the substrate S. Even in this case, it is possible to prevent the supercritical fluid from being directly sprayed onto the substrate S. Furthermore, in this case, it is possible to suppress a reduction in speed of the supercritical fluid and thereby to allow the supercritical fluid to arrive easily to the substrate S. In other words, in the case where the blocking plate 4610 is provided to have a smaller radius than the substrate S, the supercritical drying process on the substrate S may be performed with efficiency.

The supporter 4620 may support the blocking plate 4610. For example, the supporter 4620 may be provided to support a back side of the blocking plate 4610. The supporter 4620 may be perpendicularly installed on a bottom wall of the chamber 4100. The supporter 4620 and the blocking plate 4610 may be connected to each other without any other jointing member; for example, the supporter 4620 may be laid on the blocking plate 4610 by gravity.

In certain embodiments, the supporter 4620 and the blocking plate 4610 may be connected to a jointing member (e.g., nut or bolt). Alternatively, the supporter 4620 and the blocking plate 4610 may form a single body.

The exhausting member 4700 may be configured to exhaust the supercritical fluid from the second process chamber 4000. The exhausting member 4700 may be connected to an exhausting line 4750 to exhaust the supercritical fluid to the outside. Here, a valve (not shown) may be installed on the exhausting member 4700 or the exhausting line 4750 to control an exhausting amount or rate of the supercritical fluid. In some embodiments, the supercritical fluid exhausted through the exhausting line 4750 may be released into the atmosphere or supplied to a supercritical fluid recycling system (not shown).

In some embodiments, the exhausting member 4700 may be formed to pass through the lower housing 4120. At a final state of the supercritical drying process, the supercritical fluid may be exhausted from the second process chamber 4000, and thus, the internal pressure of the second process chamber 4000 may be lowered below the critical pressure of the fluid and the fluid may be liquefied. The liquefied supercritical fluid may be exhausted through the exhausting member 4700 of the lower housing 4120, by the gravity.

The controller 4900 may control the valve 4570 and the heater 4400. In some embodiments, the controller 4900 may control the valve 4570 and the heater 4400 to allow an inner space of the chamber 4100 to have pressure and temperature suitable for the supercritical process. For example, the controller 4900 may control the valve 4570 in such a way that, during the supercritical drying process, pressure of the chamber 4100 is maintained to allow the phase of the carbon dioxide supplied therein to be directly changed from a gas state to a supercritical state. Also, the controller 4900 may control the heater 4400 in such a way that, during the supercritical drying process, temperature of the chamber 4100 is maintained to allow the phase of the carbon dioxide supplied therein to be directly changed from a gas state to a supercritical state.

Figure 5:
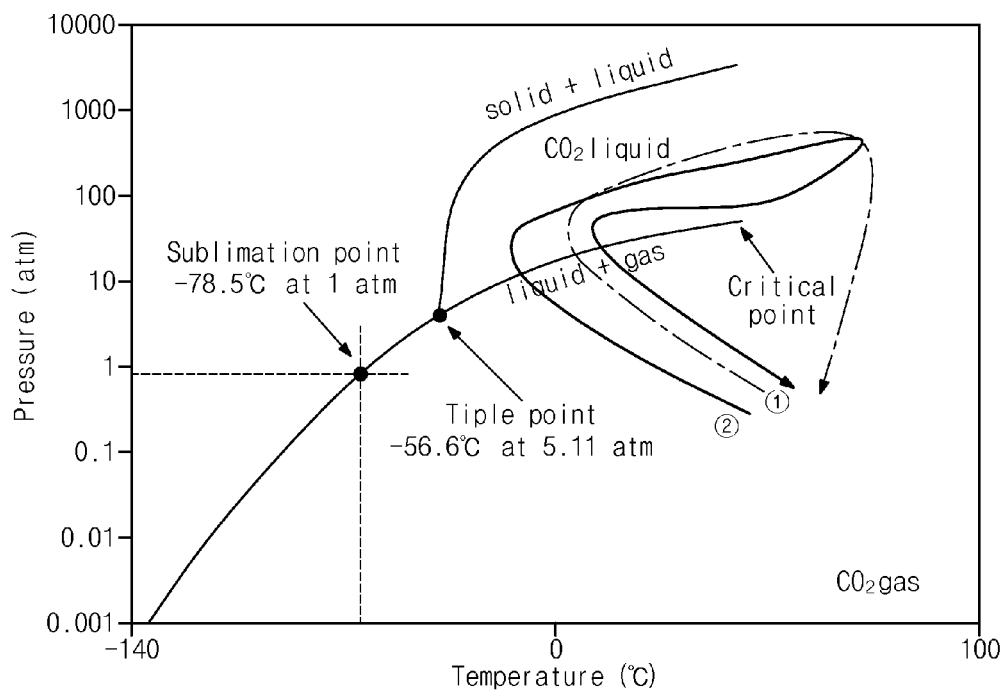
FIG. 5 is a graph showing a change in phase of a process fluid which occurs when a supercritical fluid process is performed in a conventional substrate treating system.
Figure 6:
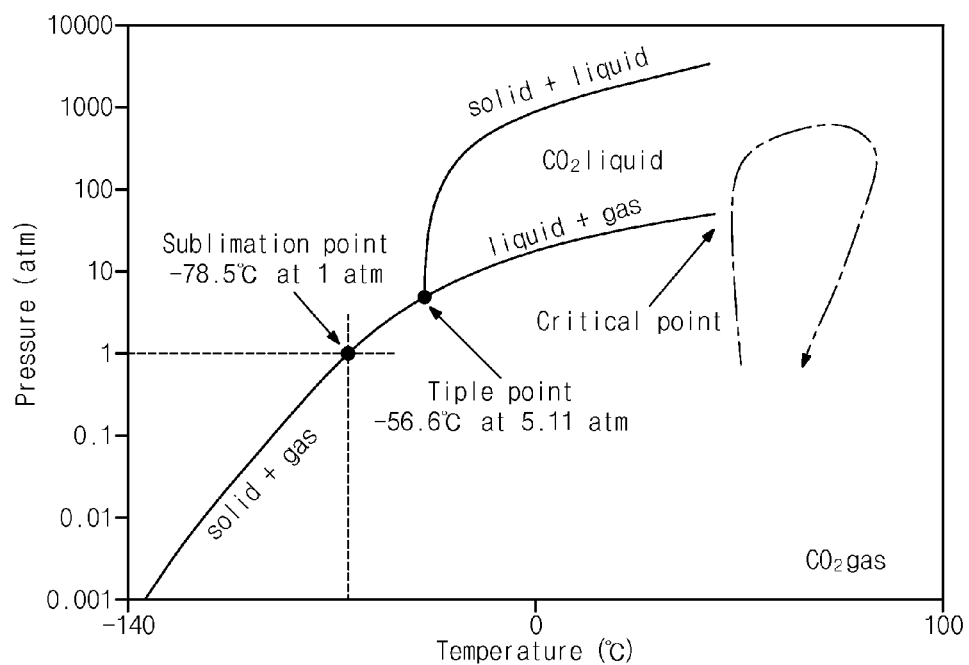
FIG. 6 is a graph showing a change in phase of a process fluid which occurs when a supercritical fluid process is performed in a substrate treating system according to example embodiments of the inventive concept.
Figure 7:
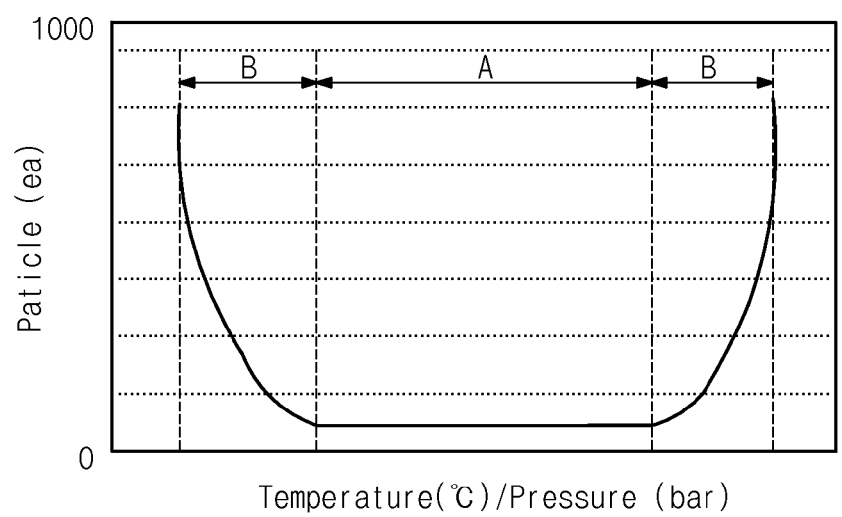
FIG. 7 is a graph showing dependence of the particle number on temperature and pressure of a process fluid, when a substrate treating process is performed in the second process chamber of FIG. 2.

FIG. 5 is a graph showing a change in phase of a process fluid which occurs when a supercritical fluid process is performed in a conventional substrate treating system, FIG. 6 is a graph showing a change in phase of a process fluid which occurs when a supercritical fluid process is performed in a substrate treating system according to example embodiments of the inventive concept, and FIG. 7 is a graph showing dependence of the particle number on temperature and pressure of a process fluid, when a substrate treating process is performed in the second process chamber of FIG. 2.

For the sake of simplicity, the description that follows will refer to an example of the present embodiment in which carbon dioxide is used as the supercritical fluid. Referring to FIG. 5, carbon dioxide is supplied into a chamber of a conventional substrate treating system. At an initial stage of the supplying step, the carbon dioxide supplied into the chamber has pressure and temperature allowing the carbon dioxide to have a supercritical state. If the supercritical carbon dioxide is supplied into the chamber, it is adiabatically expanded. As a result of the adiabatic expansion, the carbon dioxide has a lowered temperature, and this may lead to a change in phase of the carbon dioxide. For example, the carbon dioxide may contain gaseous and liquid portions which are mixed with each other. Thereafter, if the pressure of the carbon dioxide in the chamber is increased, the carbon dioxide has the supercritical phase, and thus, the substrate treating process may be normally performed. The curve ① or ② of FIG. 5 illustrates examples of this change in phase of the carbon dioxide.

However, in the case where the phase of the carbon dioxide is changed in such a way that gaseous and liquid portions are contained therein, many particles may be produced to cause process failures in the substrate treating process. The number of particles to be produced during the process of FIG. 5 is shown in the region 'A' of FIG. 7.

According to example embodiments of the inventive concept, during the substrate treating process, an amount of carbon dioxide supplied into the chamber and temperature of the chamber may be controlled by the controller, and for example, this control may make it possible to allow the supplied carbon dioxide to be directly changed from the gas state to the supercritical state. The curve of FIG. 6 illustrates the progression of the substrate treating process according to example embodiments of the inventive concept.

In the case where, as shown in FIG. 6, pressure and temperature of carbon dioxide are controlled, the number of particles to be produced during the process is reduced, and this may make it possible to improve process efficiency in a substrate treating process using supercritical fluid. The number of particles to be produced during the process of FIG. 6 is shown in the region 'B' of FIG. 7.

According to example embodiments of the inventive concept, when a substrate cleaning process is performed using supercritical fluid, it is possible to control temperature and pressure of the supercritical fluid, and this may make it possible to improve efficiency of the substrate cleaning process.

According to other example embodiments of the inventive concept, when a substrate cleaning process is performed using supercritical fluid, it is possible to control temperature and pressure of the supercritical fluid, and this may make it possible to reduce the number of particles to be produced in the substrate cleaning process and thereby to improve efficiency of the substrate cleaning process.

While example embodiments of the inventive concepts have been particularly shown and described, it will be understood by one of ordinary skill in the art that variations in form and detail may be made therein without departing from the spirit and scope of the attached claims.

What is claimed is:

1. A method of treating a substrate, comprising:
   supplying supercritical carbon dioxide into a chamber to treat a substrate;
   drying the substrate using the supercritical carbon dioxide to remove an organic solvent from a gap between patterns of the substrate, wherein
      a temperature and a pressure of the chamber are maintained to allow carbon dioxide to be directly changed from a gas state to a supercritical state when the carbon dioxide is supplied into the chamber.

2. A substrate treating system, comprising:
   a chamber having a treatment space therein;
   a supporting device in the treatment space to support a substrate;
   a fluid supply configured to supply supercritical carbon dioxide into the treatment space, the fluid supply including a valve configured to control an amount of fluid supplied into the chamber;
   a heater configured to heat the chamber; and
   a controller configured to heat the heater, the controller configured to control,
      the heater such that a temperature of the chamber is maintained to allow carbon dioxide to be directly changed from a gas state to a supercritical state when the carbon dioxide is supplied into the chamber, and
      the valve such that a pressure of the chamber is maintained to allow carbon dioxide to be directly changed from a gas state to a supercritical state when the carbon dioxide is supplied into the chamber.

* * * * *